(12) United States Patent
Zhang et al.

(10) Patent No.: US 6,528,360 B2
(45) Date of Patent: Mar. 4, 2003

(54) SEMICONDUCTOR DEVICE AND PROCESS FOR MANUFACTURING THE SAME, AND ELECTRONIC DEVICE

(75) Inventors: Hongyong Zhang, Kanagawa (JP); Satoshi Teramoto, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 09/999,739

(22) Filed: Oct. 23, 2001

(65) Prior Publication Data

US 2002/0053703 A1 May 9, 2002

Related U.S. Application Data

(62) Division of application No. 08/939,705, filed on Sep. 29, 1997, now Pat. No. 6,459,124.

(30) Foreign Application Priority Data

Oct. 2, 1996 (JP) .......................................... 08-281703

(51) Int. Cl.⁷ ............................................. H01L 21/00
(52) U.S. Cl. ....................................... 438/154; 257/347
(58) Field of Search ................................. 438/154, 149, 438/151, 153, 157, 160; 257/347, 351

(56) References Cited

U.S. PATENT DOCUMENTS

| | | | |
|---|---|---|---|
| 5,015,597 A | | 5/1991 | Vinouze et al. .............. 437/41 |
| 5,091,337 A | * | 2/1992 | Watanabe et al. ........... 437/181 |
| 5,114,869 A | * | 5/1992 | Tanaka et al. ................. 43/40 |
| 5,416,340 A | * | 5/1995 | Yoshida et al. ............... 257/59 |
| 5,583,369 A | | 12/1996 | Yamazaki et al. ......... 257/635 |

FOREIGN PATENT DOCUMENTS

| | | |
|---|---|---|
| GB | 2 233 822 | 1/1991 |
| JP | 4-241452 | 8/1992 |

* cited by examiner

Primary Examiner—David Nelms
Assistant Examiner—Quoc Hoang
(74) Attorney, Agent, or Firm—Fish & Richardson P.C.

(57) ABSTRACT

An opening for separating elements is formed in self-alignment by making use of a pattern of electrodes. This eliminates the patterning margin which might otherwise be required for the element separation. Thus, the degree of integration of a thin film transistor circuit can be further raised.

48 Claims, 18 Drawing Sheets

*LASER BEAM IRRADIATION*

SEMICONDUCTOR DEVICE AND PROCESS FOR MANUFACTURING THE SAME, AND ELECTRONIC DEVICE

BACKGROUND OF THE INVENTION

1. Field of the Invention

The present invention relates to a structure having integrated thin film transistors, a process for manufacturing the structure, and an electronic device having the structure.

2. Related Art

As a device (as will be widely called the "semiconductor device") employing thin film transistors (as generally called the "TFT"), there are known an active matrix type liquid crystal display device and an active matrix type display device employing EL elements. The thin film transistors have their other applications to a variety of integrated circuits having memory and arithmetic functions.

In recent years, there has been noted an active matrix type liquid crystal display device in which an active matrix circuit (as may also be called the "pixel circuit" or "pixel matrix circuit") and a peripheral drive circuit (as may also be called the "driver circuit") are integrated over a common glass substrate or a quartz substrate. This construction is called the "peripheral drive circuit integrated type."

FIG. 7 shows a summary of a circuit arrangement of a substrate (as will be called the "TFT substrate") at the side where the TFTs of the active matrix type liquid crystal display device are formed. Over the common substrate (e.g., a glass substrate or a quartz substrate) 301, as shown in FIG. 7, there are arranged an active matrix circuit 303, and peripheral drive circuits 302 and 304 for driving the active matrix circuit 303. These circuits are composed of the TFTs.

Here, in the peripheral drive circuit 304 (or 302 because both have basically similar structures), as shown at 308 in an enlarged scale, elements 307 including a P-channel type TFT 305 (as will be called the "PTFT") and an N-channel type TFT 306 (as will be called the "NTFT") in combination in the complementary type (or CMOS structure) are arrayed to correspond to the source lines or gate lines of the active matrix circuit.

The numeral 307 designates an analog switch, but a shift register circuit or a buffer circuit is constructed basically of the CMOS elements 307.

The circuit 308 is called the "analog switch ", which is located at the final stage for feeding the signal to the source lines finally. In this sense, the circuit 308 is also called the driver circuit or the driver stage.

When the difference in the impedance between wiring lines, it is desired that the CMOS elements 307 are arrayed in a line, as shown in FIG. 7. This array is made to suppress the fine disturbance which might otherwise be caused in the signal to be fed to the active matrix circuit due to the difference in the impedance between the wiring lines.

As a method for forming a crystalline silicon film (as generally expressed as "P-Si") forming the active layer of the TFT, on the other hand, there is a technique making use of a method (as will be called the "laser annealing method") using the irradiation with a laser beam having a linear beam shape.

When this technique is adopted, there is a problem that the crystallization is made slightly different in the dispersion of the energy density in the scanning direction. When a number of elements required to have identical characteristics are to be integrated, therefore, it is preferable that those elements are arrayed in a row, as shown at 308.

The performances, as required of the display device, are a large-area screen, a fine display and a high-speed motion display. The structure, in which the CMOS elements 307 are arrayed in a row, as shown at 308 in FIG. 7, finds it difficult in size and area to meet those requirements.

As a matter of fact, therefore, there is adopted a structure in which the elements are arranged, as shown in FIG. 8. In this structure, more specifically, the numerous elements are staggered from each other.

When this structure is adopted, however, there still remain the aforementioned problems:

(1) the difference in the element characteristics, as caused due to the difference in the crystallization of the active layer between the different stages; and (2) the difference in the wiring impedance.

These problems cause stripe patterns in the display or unevenness.

Especially the problem (1) involves the stability in the output of the laser annealing apparatus and the errors in the optical system so that its influence cannot be ignored.

The aforementioned problems are mainly caused by the large area (or large size) which is occupied by the CMOS elements 307 of FIG. 7.

If the area, as occupied by the CMOS elements 307, is reduced, therefore, it is possible to array them in a line, as shown in FIG. 7. Then, there arises none of the aforementioned problems.

This problem that the CMOS elements 307 take a large area (or size) will be described in more detail.

FIG. 9 is an enlarged schematic diagram showing a CMOS element 307 of FIG. 7. Reference numeral 214 appearing in FIG. 9 designates a CMOS element having a structure in which the PTFTs and the NTFTs are constructed in the complementary shape. On the other hand, numeral 215 designates a portion of the adjoining CMOS element.

First of all, here will be described the individual parts of the element 214. This element 214 is formed, as its active layer, of a semiconductor layer 202 of the PTFT and a semiconductor layer 216 of the NTFT.

In FIG. 9, numeral 203 designates a gate electrode of the PTFT, and numeral 205 designates a gate electrode of the NTFT. These two gate electrodes are extended and jointed together in a pattern 204.

Numeral 201 designates a source electrode of the PTFT, and numeral 208 designates a source electrode of the NTFT. These two source electrodes are also jointed together in an extended pattern.

Numeral 206 designates a drain electrode shared between the two TFTs. The drain electrode 206 is extended in a pattern 213 to the source line of the active matrix circuit.

Numeral 207 designates openings for contacting with the source region of the active layer 202 of the PTFT. Through these openings, there is established a contact between the source electrode 201 and the source region 202.

When the structure shown in FIG. 9 is adopted, the minimums of the interval between the elements and the size of the elements are determined from the relation in the mask registration accuracy.

Here will be described the case in which the 3 $\mu$m rule is adopted for the photolithography, for example.

When the 3 $\mu$m rule is adopted, the size, as defined by arrows in FIG. 9, takes 3 $\mu$m at the minimum. As a result, the interval between the source contacts of the adjoining elements 217 takes 15 $\mu$m at the minimum.

For one CMOS element, moreover, the distance, as designated by 218, takes 9 $\mu$m at the minimum.

SUMMARY OF THE INVENTION

The present invention contemplates to provide a novel construction which can minimize the area to be shared by elements, when the circuitry shown in FIG. 7 is to be realized, thereby to array the numerous elements in a line.

According to one feature of the present invention, as partially shown of its specific manufacture process in FIG. 5, when at least two bottom gate type thin film transistors 14 and 15, as arranged adjacent to each other, are to be formed, the active layer of the two thin film transistors is separated (at an opening 145) in self-alignment by making use of the pattern of source electrodes 138 and 139 (or the pattern of drain electrodes).

According to another feature of the present invention, as partially shown of its specific manufacture process in FIG. 5, when at least two CMOS elements composed of bottom gate type P- and N-Channel type thin film transistors, as arranged adjacent to each other, are to be formed, the semiconductor layer forming the two elements is separated (at the opening 145) in self-alignment by making use of the pattern of source electrodes 138 and 139 (or the pattern of drain electrodes).

In the construction shown in FIG. 5, the active layers of the P-channel type thin film transistors (PTFT) and the N-channel type thin film transistor (NTFT), as composing the CMOS element, are formed of a common semiconductor layer.

Another construction of the present invention comprises:

at least two bottom gate type thin film transistors arranged adjacent to each other, wherein the active layer of the two thin film transistors is separated in self-alignment by making use of the pattern of source or drain electrodes.

Another construction of the present invention comprises:

at least two CMOS elements including bottom gate type P- and N-channel type thin film transistors arranged adjacent to each other, wherein the semiconductor layer formed the two elements is separated in self-alignment by making use of the pattern of source or drain electrodes.

Adopting these construction described above, a part of the end portions of the elements, as separated at the portions of the opening 145 in FIG. 5, is identical in its side to the end portion of the pattern of the source or drain electrode. This is the result of the self-alignment process making use of the electrode pattern.

These construction can be applied not only to the integrated circuit itself but also to electronic devices using the integrated circuit, such as the display of a data processing terminal or a video camera, as shown in FIG. 18. These devices will be generically called the "electronic device".

DESCRIPTION OF THE PREFERRED EMBODIMENTS

Figure 5:
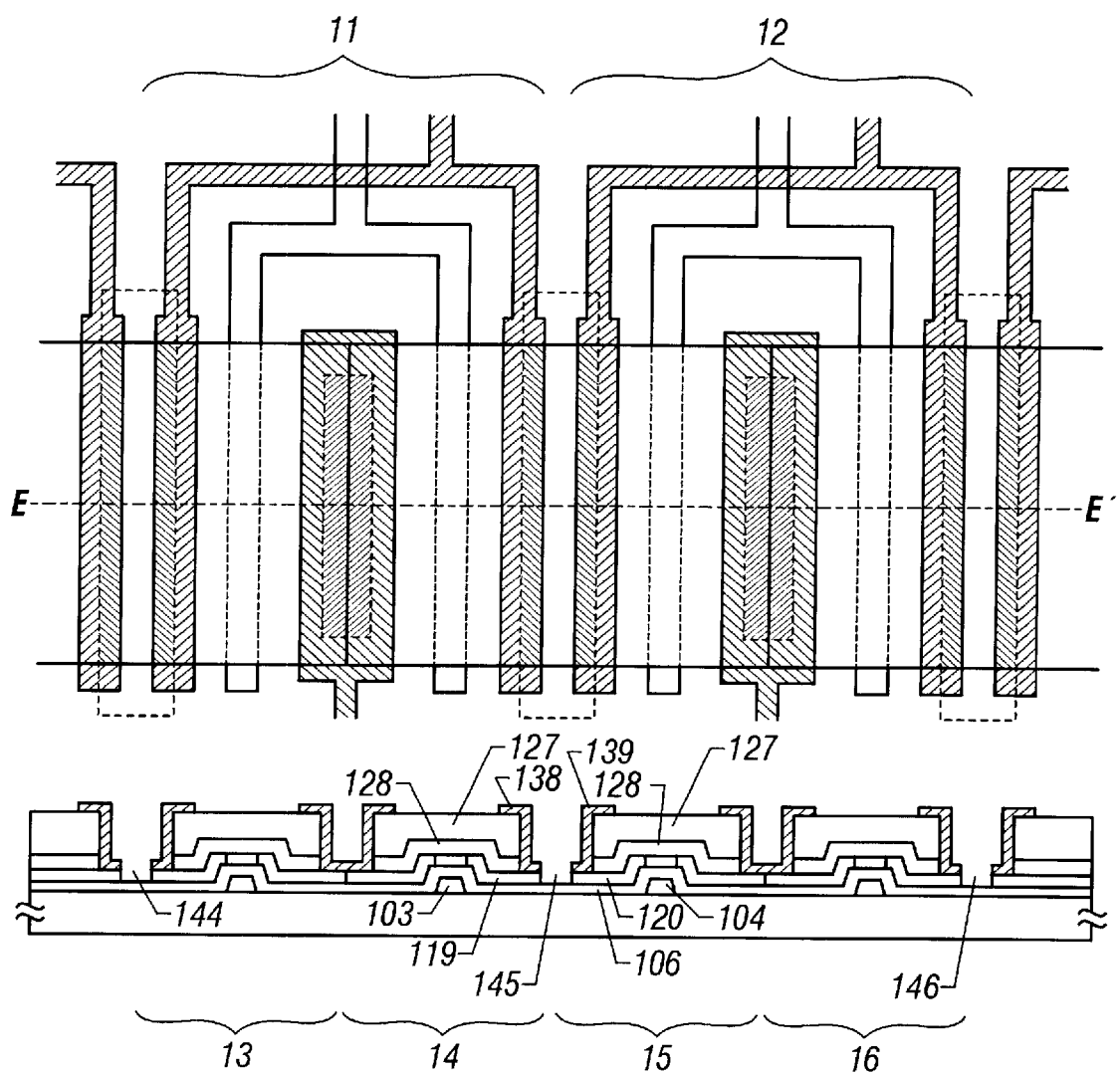
FIG. 5 is a diagram showing a manufacture step of the embodiment.

As shown in FIG. 5, the pattern of electrodes 138 and 139 is utilized to form an opening 145 thereby to separate the adjoining CMOS elements and the adjoining TFTs 14 and 15.

Thus, it is possible to pack the elements closely thereby to enhance the degree of integration.

[Embodiment 1]

The present embodiment relates to a construction in which there are arrayed in a line the CMOS elements composed PTFTs and NTFTs of bottom gate type in a complementary shape.

Here, it is needless to say that the filming conditions and the various parameters can be timely selected or altered, when applied, according to the knowledge of those skilled in the art.

Figure 1:
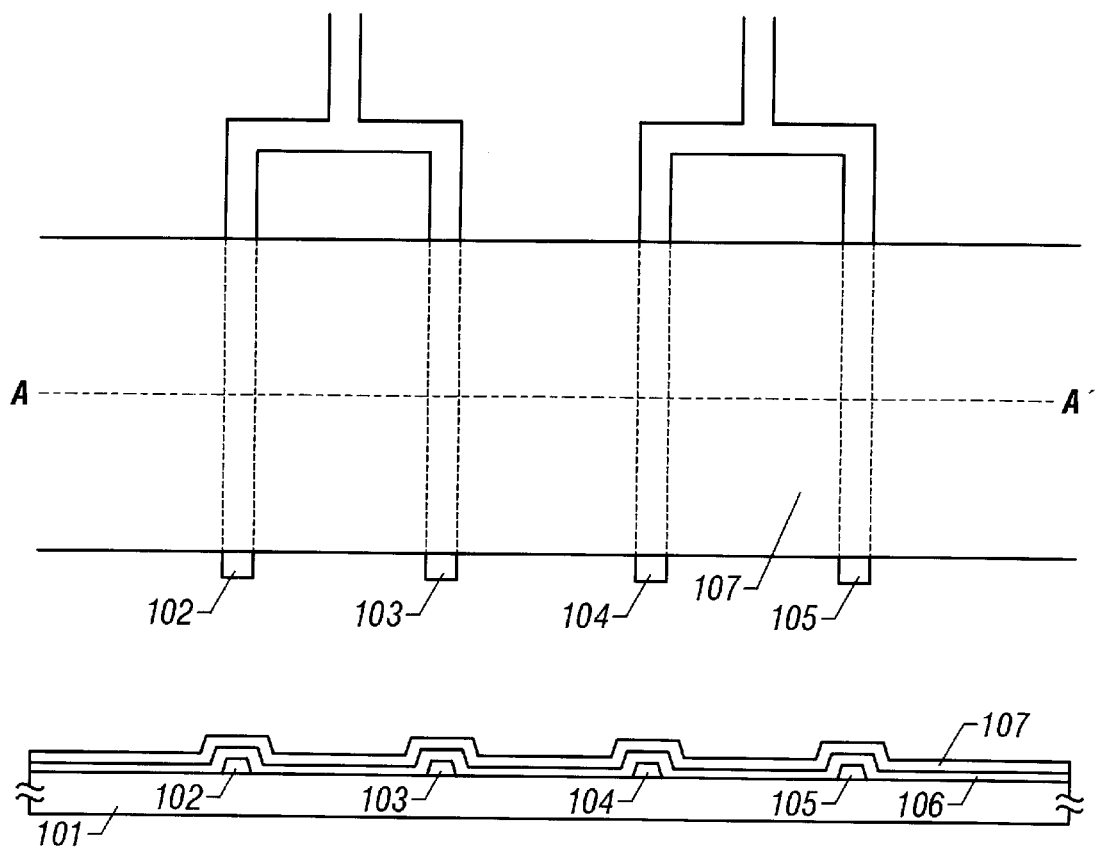
FIG. 1 is a diagram showing a manufacture step of an embodiment.

FIG. 1 and subsequent Figures are schematic diagrams showing the manufacture steps of the present embodiment schematically. In FIG. 1, a section, as taken along line A–A', presents a sectional view, as located below.

First of all, as shown in FIG. 1, there are formed over a glass substrate (or quartz substrate) 101 gate electrodes 102, 103, 104 and 105.

Here, the gate electrodes are made of aluminum but may naturally be made of another conductive material.

As shown, the gate electrodes 102 and 103 are given a structure in which they are extended and connected to each other. The gate electrodes 104 and 105 are also given a structure in which they are extended and connected to each other.

The paired gate electrodes 102 and 103 construct a gate electrode of one CMOS element. Specifically, the gate electrode 102 makes a gate electrode of the PTFT composing the CMOS. The gate electrode 103 makes a gate electrode of the NTFT composing the CMOS.

On the other hand, the gate electrodes 104 and 105 make the gate electrodes of the PTFT and NTFT of another CMOS. In short, FIG. 1 shows the state in which the two CMOS elements are being manufactured.

The aluminum gate electrodes 102 to 105 are then anodized to form the not-shown anodized film thereon. This anodized film has functions to protect the surfaces of the gate electrodes physically and electrically and to suppress formation of hillock or whisker. Another function is to prevent the vertical short-circuit through the pin holes of the interlayer insulating film.

The hillock or whisker is a filament- or needle-shaped projection which is made by an abnormal growth of aluminum.

Then, a silicon oxide film 106 to function as a gate insulting film is filmed to have a thickness of 1,000 Å. The filming method is exemplified by the plasma CVD method using TEOS and oxygen as the filming gas.

Next, a semiconductor film is formed to make an active layer of the thin film transistor. At first, a not-shown amorphous silicon film is filmed to have a thickness of 500 Å by the vacuum thermal CVD method. Next, the amorphous silicon film is crystallized by irradiating it with a laser beam. Moreover, a patterning is effected by using the known technique of photolithography to form a crystalline silicon film, as designated at 107.

This crystalline silicon film may be formed by another means such as a heat treatment or a lamp irradiation. Alternatively, the amorphous silicon film may be left as it is.

Figure 2:
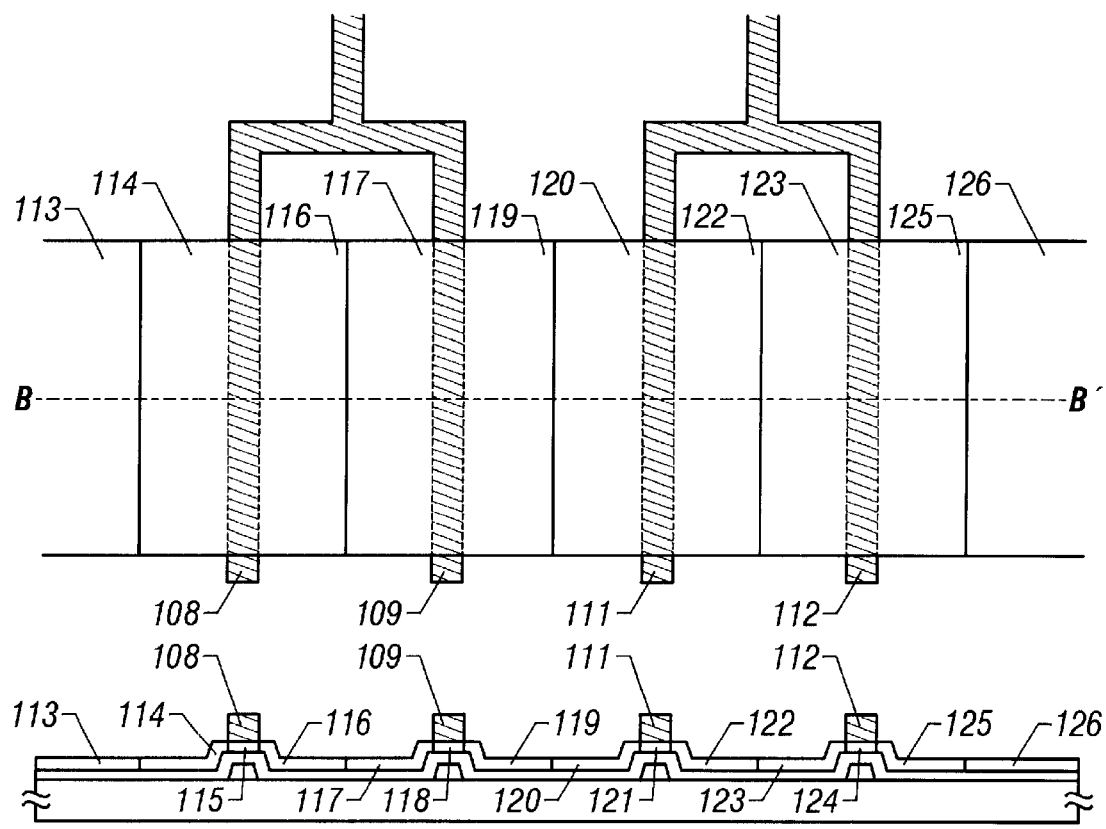
FIG. 2 is a diagram showing a manufacture step of the embodiment.

Thus, the state shown in FIG. 1 is established. Next, masks 108, 109, 111 and 112 of a silicon nitride film are formed, as shown in FIG. 2.

This mask pattern is formed by exposing the back of the substrate using the gate electrodes as the masks.

According to this method, the mask pattern, as designated by 108, 109, 111, 112, can be formed in self-alignment by using the pattern of gate electrodes. Here, the section, as taken along line B–B' of FIG. 2, presents a sectional view, as located below.

Next, a not-shown resist mask is arranged to effect a selective doping with P (phosphorus) and B (boron). This doping step resorts to the plasma doping method.

This doping step is conditioned by regions 114, 116, 120, 122 and 126 of P-type and regions 113, 117, 119, 123 and 125 of N-type.

At the end of the doping, the not-shown resist masks (for the doping) and then the masks 108, 109, 111 and 112 are removed. By the irradiation with the laser beam, the damage of the doped regions is annealed, and the doping impurities are activated.

Here, the regions 114 and 116 and the regions 120 and 122 provide the source and drain regions of the PTFT.

On the other hand, the regions 117 and 119 and the regions 123 and 125 provide the drain and source regions of the NTFT.

Moreover: numeral 115 designates the channel region of the PTFT; numeral 118 the channel region of the NTFT; numeral 121 the channel region of the PTFT; and numeral 124 the channel region of the NTFT.

Here, numeral 113 designates the N-type region (or source region) of the NTFT making the not-shown CMOS element, as located at the lefthand side. On the other hand, numeral 126 designates the P-type region (or source region) of the PTFT making the not-shown CMOS element, as located at the righthand side.

Figure 3:
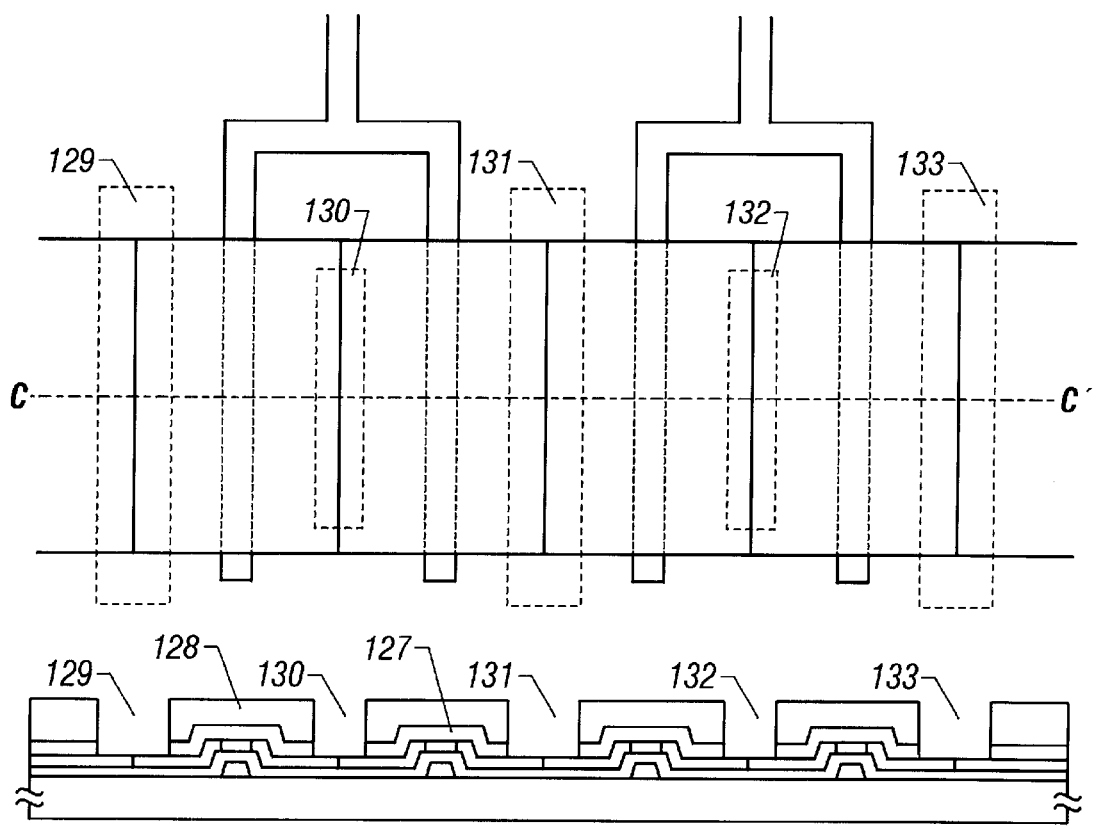
FIG. 3 is a diagram showing a manufacture step of the embodiment.

Next, as shown in FIG. 3, a silicon nitride film 127 and a polyimide film 128 are formed as a interlayer insulating film. The silicon nitride film is formed by the plasma CVD method, and the polyimide film is formed by a method using the spin coating method. Here, the section, as taken along line C–C' of FIG. 3, presents a sectional view, as located below.

Here, the polyimide can be replaced by polyamide or polyimide-amide.

After the interlayer insulating film was formed of a laminated film of the silicon nitride film 127 and the polyimide film 128, there are formed contact holes, as designated by 129, 130, 131, 132 and 133. At this step, the semiconductor layer is exposed (as shown in FIG. 3) at the bottoms of the individual contact holes.

In this state, the semiconductor layer for making a plurality of CMOS elements are shared. Specifically, the active layers of a plurality of (or two, as shown) CMOS elements are made so common that P- and N-type regions can be selectively formed.

Next, a laminated film of a titanium film, an aluminum film and a titanium film is formed over the interlayer insulating film. This laminated film is provided for forming source electrodes, wiring lines extending from the former, drain electrodes and wiring lines extending from the former.

There is arranged a resist mask, as represented by 400. Then, the laminated film, as composed of the titanium, aluminum and titanium films, is patterned by the dry etching method. Subsequent to this etching step of the laminated film, the underlying active layer is etched.

The dry etching method is exemplified by the RIE method using a mixed gas of $SiCl_4$, $Cl_2$ and $BCl_2$ as the etching gas. When this etching gas is employed, the laminated film, as composed of the titanium, aluminum and titanium films, can be etched, continuously followed by the etching of the silicon film forming the active layer.

Figure 4:
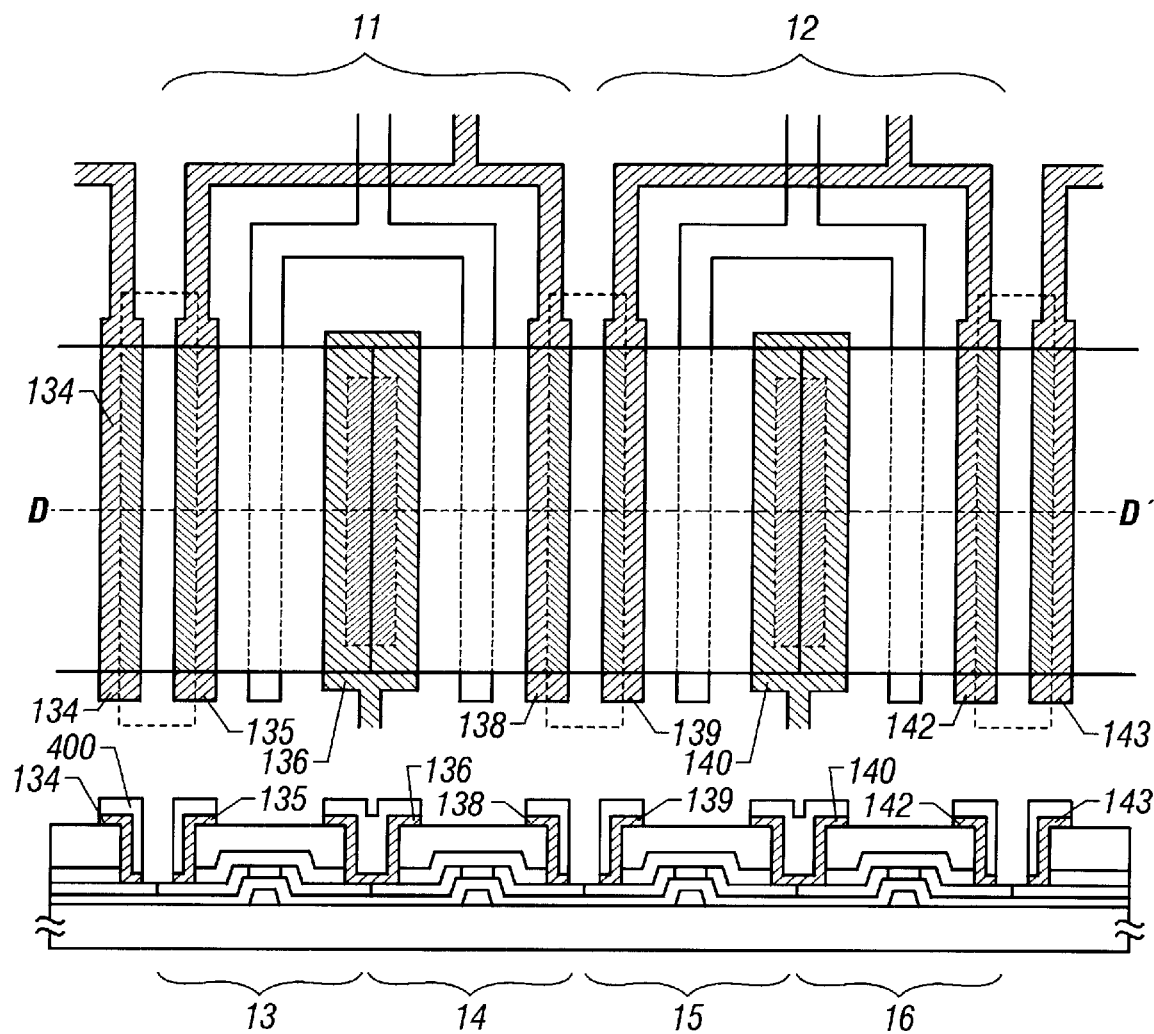
FIG. 4 is a diagram showing a manufacture step of the embodiment.

FIG. 4 shows a state in which the laminated film composed of the titanium, aluminum and titanium films is patterned. In this state, the etching of the laminated film was ended, and the active layer is midway of the etching while being exposed.

As a matter of fact, it is difficult to interrupt the etching in the state of FIG. 4.

Here, the section, as taken along line D–D' of FIG. 4, presents a sectional view, as located below.

In FIG. 4, there are shown a source electrode 135 and a drain electrode 136 of the PTFT 13 and a source electrode 138 and the drain electrode 136 of the NTFT 14, as composing a lefthand CMOS element 11. As apparent from FIG. 4, the drain electrode 136 is shared between the two TFTs.

In FIG. 4, there are also shown a source electrode 139 and a drain electrode 140 of the PTFT 15, and a source electrode 142 and the drain electrode 140 of the NTFT 16, as composing a righthand CMOS element 12. As apparent from FIG. 4, the drain electrode 140 is shared between the two TFTs.

On the other hand, numeral 134 designates a source electrode of the NTFT of the lefthand CMOS element. Moreover, numeral 143 designates a source electrode of the PTFT of the righthand CMOS element.

Subsequent to the state shown in FIG. 4, the exposed semiconductor layer is etched and then the resist mask 400 is removed. As a result, grooves 144, 145 and 146 are formed, as shown in FIG. 5, to isolate the semiconductor (or active layer) into the individual CMOS element units.

This isolation is performed in self-alignment by utilizing the pattern for forming the source electrodes. Specifically, the patterning of the active layer for separating the CMOS elements is not performed for itself, but the conductor layer can be separated for the individual elements simultaneously as the pattern of the source electrodes (or drain electrodes) is formed.

In this case, the mask for separating the semiconductor layer and the mask (as represented by 400 in FIG. 4) for patterning the source electrodes are identical. As a result, any special mask need neither be arranged for separating the semiconductor layer, nor is required a mask registration margin therefor. Moreover, the interval of the CMOS elements can be accordingly narrowed.

Moreover, the PTFT and NTFT composing the CMOS element are made of the common semiconductor layer so that their interval can be minimized.

When the construction of the present embodiment is adopted, it is also possible to enlarge the contact areas of the source and drain electrodes with the semiconductor layer (or active layer).

[Embodiment 2]

The present embodiment relates to a construction in which two TFTs are juxtaposed with a narrowed interval.

What is disclosed in Embodiment 1 is the construction in which a plurality of CMOS elements are arranged in a line with their intervals being narrowed (as shown in FIG. 5).

However, the invention to be disclosed herein should not be limited in its application to the formation of the CMOS elements disclosed in Embodiment 1.

One point of the invention to be disclosed herein is that the groove (or removed region of the semiconductor for the separation), as designated by 145 in FIG. 5, is formed simultaneously as the source or drain electrode is patterned.

This makes it arbitrary to combine the channel types of the TFTs to be separated. In other words, the combination may be made between the PTFT and PTFT or between the NTFT and NTFT.

Moreover, the arrangement can also be applied to the case in which the adjoining elements are not aligned but offset from each other.

Thus, the invention to be disclosed herein can be applied to a technique capable of narrowing the interval between the adjoining TFTs.

Here will be described a specific example, in which the NTFT 14 and the PTFT 15 of FIG. 5 are noted. These two TFTs do not compose a CMOS.

In this case, the NTFT 14 and the PTFT 15 are separated by separating the active layer through the groove 145. In short, the two adjoining TFTs are separated.

The groove 145 is formed in self-alignment by advancing the etching when the source electrode 138 of the PTFT 14 and the source electrode 139 of the NTFT 15 are patterned.

In other words, the PTFT 14 and the NTFT 15 are separated simultaneously as the source electrode 138 of the PTFT 14 and the source electrode 139 of the NTFT 15 are patterned.

Thus, the adjoining TFTs can be separated in self-alignment to eliminate the margin (or excessively set size) in the masking accuracy for the element separation. Accordingly, the interval between the adjoining elements can be narrowed.

[Embodiment 3]

The present embodiment presents an example in which the structure of the TFTs is modified in the construction of Embodiment 1.

FIG. 6 shows a process for manufacturing a thin film transistor according to the present embodiment. Here, the same reference numerals as those of FIGS. 1 to 5 designate the same portions. The process is identical to Embodiment 1 unless otherwise specified.

Figure 6A:
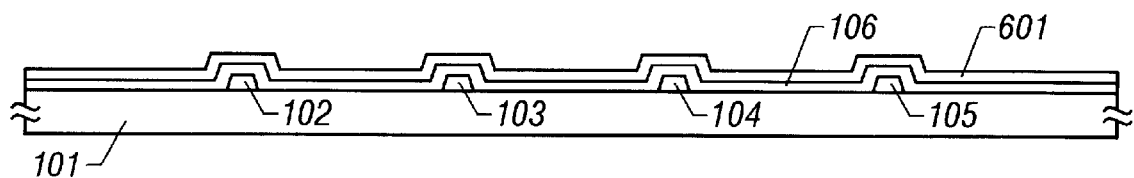
FIG. 6 is a diagram showing a manufacture step of an embodiment.

First of all, the state, as shown in FIG. 6A, is established according to the steps enumerated in Embodiment 1. In this state, the crystallization by the irradiation with the laser beam is not performed to leave a film 601 amorphous.

Next, the masks 108, 109, 111 and 112 of a silicon nitride film are formed by exposing their backs, Then, a selective doping with an impurity for imparting a conduction type is performed. At this step, the N-type regions 113, 117, 119, 123 and 125 are formed, and the P-type regions 114, 116, 120, 122 and 126 are formed.

Figure 6B:
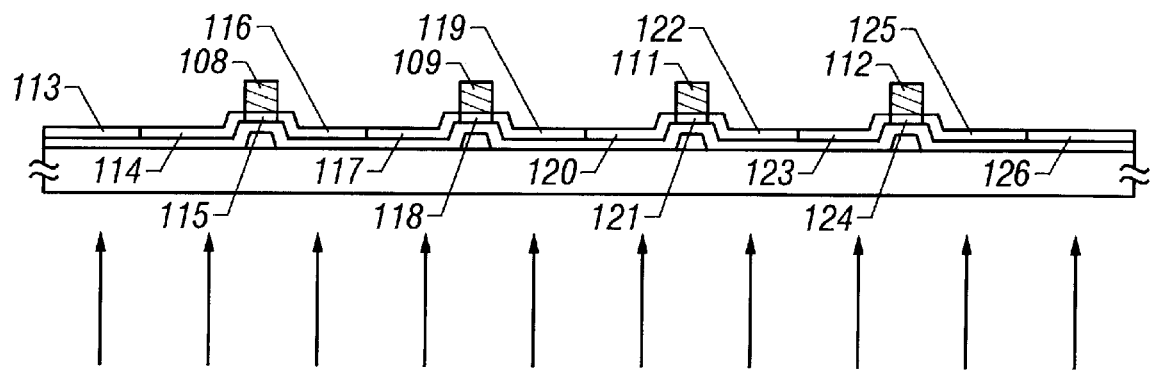
Figure 7:
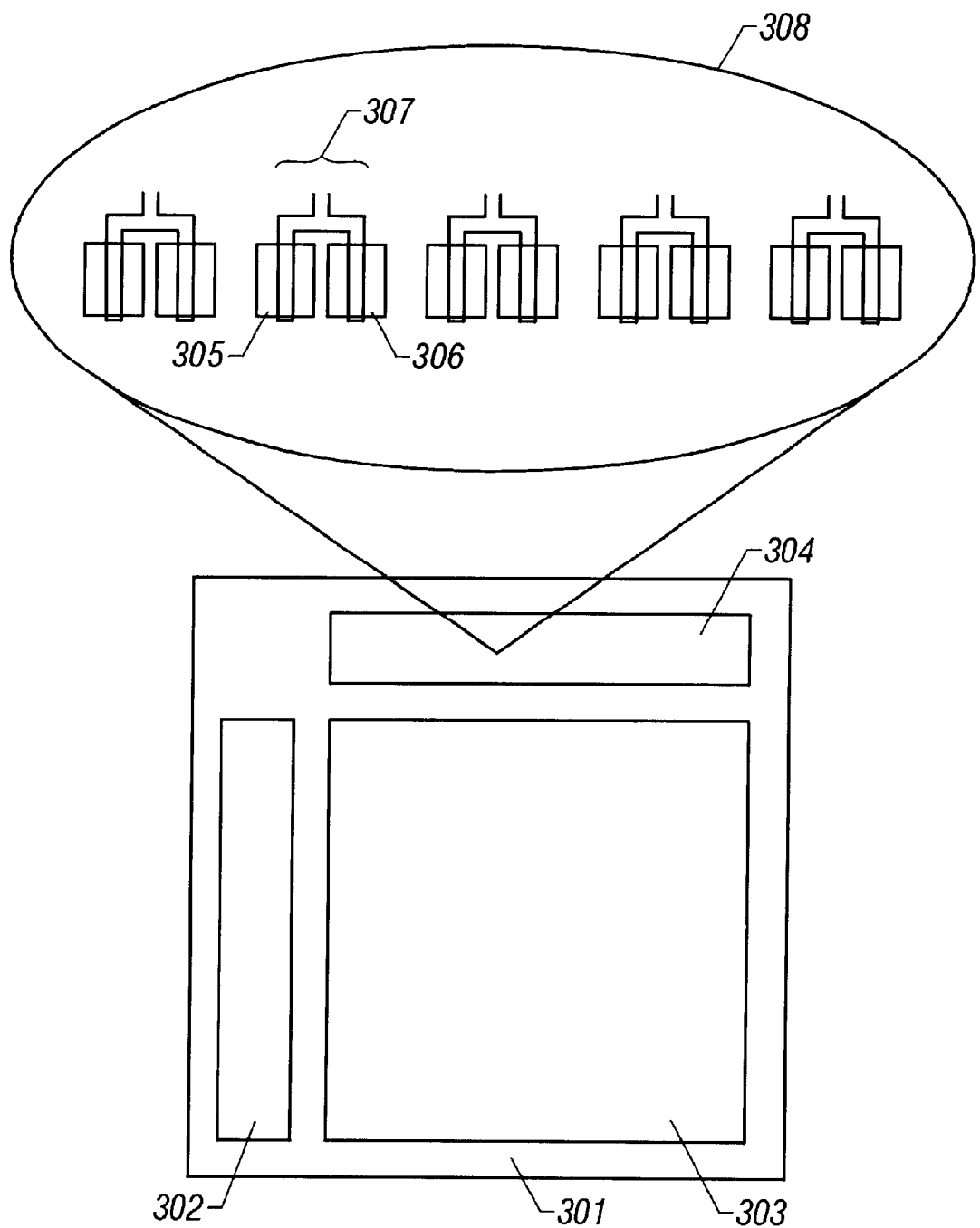
FIG. 7 is a diagram showing an active matrix type liquid crystal display device schematically.
Figure 8:
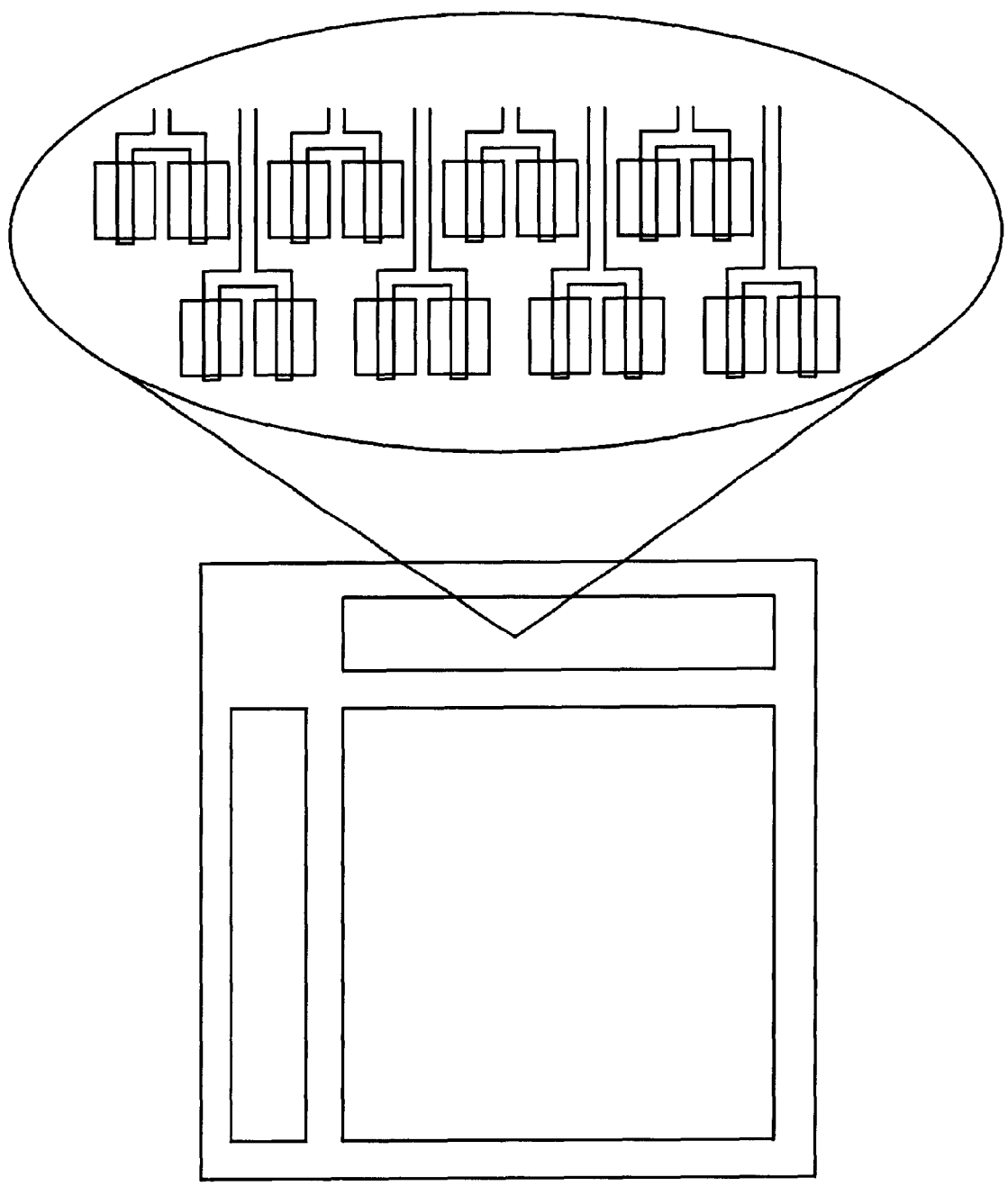
FIG. 8 is a diagram showing an active matrix type liquid crystal display device schematically.
Figure 9:
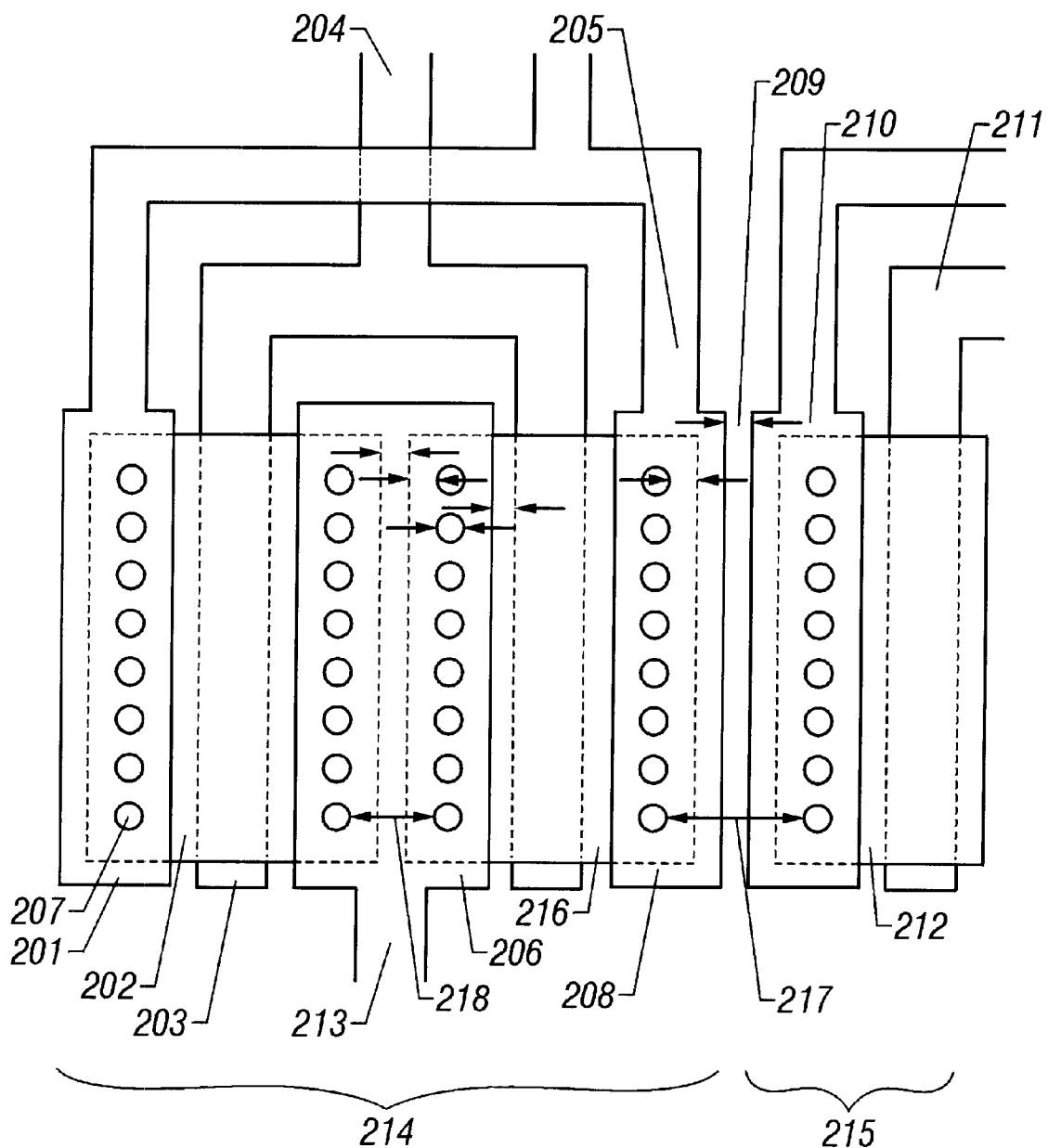
FIG. 9 is a diagram schematically showing CMOS elements juxtaposed to each other.

Then, the substrate 101 is irradiated at its back with the laser beam, as shown in FIG. 6B. At this step, the regions 113, 114, 116, 117, 119, 120, 122, 123, 125 and 126 are activated. Simultaneously with this, these regions are crystallized.

Subsequently, the steps of Embodiment 1 are followed to provide the construction in which a number of CMOS elements are arrayed in a line over the glass substrate.

[Embodiment 4]

The present embodiment presents an example in which an active matrix type liquid crystal display device is constructed by applying the invention disclosed herein.

The following problems remain in the active matrix type liquid crystal display device having a structure in which an active matrix circuit and a peripheral drive circuit are integrated over a common substrate.

Generally, the peripheral drive circuit is composed of a gate driver circuit and a source driver circuit. These circuits are required to act at a higher frequency than that of the active matrix circuit. Especially the source driver circuit is required to act at a higher frequency than that of the gate driver circuit.

For example, the source driver is required to act at 10 MHz or a higher frequency. Here, the gate driver is required to act at about several tens KHz.

The existing TFT (as shortly referred to as "P-SiTFT") made of crystalline silicon cannot be operated at a frequency up to several MHz.

As a result, when the existing TFT conforms to the VGA standards, the gate driver can be constructed, but the source driver cannot be constructed as it is.

By devising the operating method, therefore, the source driver is constructed of the TFTs which can act at a frequency up to several MHz. More specifically, the device adopts an action method in which the action rate actually desired is lowered to (1/the division number) by dividing the action mode.

In the present embodiment, the peripheral drive circuit portion (or source driver circuit), as demanded for acting at a high frequency, is constructed of an external IC chip (as called the "driver LSI") according to the method of the prior art, and the gate driver circuit, as can be made of the existing TFTs, is constructed by using the TFTs.

Here, the gate driver is made of the construction of Embodiment 1. Specifically, the gate driver is constructed of CMOS inverter elements which are composed of inverted stagger type TFTs made of a crystalline silicon film.

[Embodiment 5]

The present embodiment presents an example in which the gate driver circuit is composed, in the construction of Embodiment 4, of TFTs made of an amorphous silicon film. In the present embodiment, the semiconductor film forming the active layer of the TFTs is not crystallized but left amorphous in the construction of Embodiment 1.

When the construction of the present embodiment is adopted, the crystallizing step can be omitted. Since the manufacture step can be reduced, moreover, the NG in the manufacture process can be suppressed to enhance the reliability of the products.

[Reference Embodiment]

The construction of Embodiment 1 can be applied to the peripheral drive circuit of the active matrix type liquid crystal display device which is integrated with the peripheral drive circuit.

Generally in the construction having the integrated peripheral drive circuit, this peripheral drive circuit and the active matrix circuit are manufactured simultaneously with each other (that is, one feature is that such manufacture process can be adopted).

This embodiment relates to a construction in which the active matrix circuits are simultaneously formed over the common substrate in the construction of Embodiment 1.

FIG. 10 shows a process for manufacturing a thin film transistor to be arranged in the active matrix circuit. The step shown in FIG. 10A corresponds to that shown in FIG. 3. In other words, in the state shown in FIG. 3, the state shown in FIG. 10A is established in the other portion.

Figure 10A:
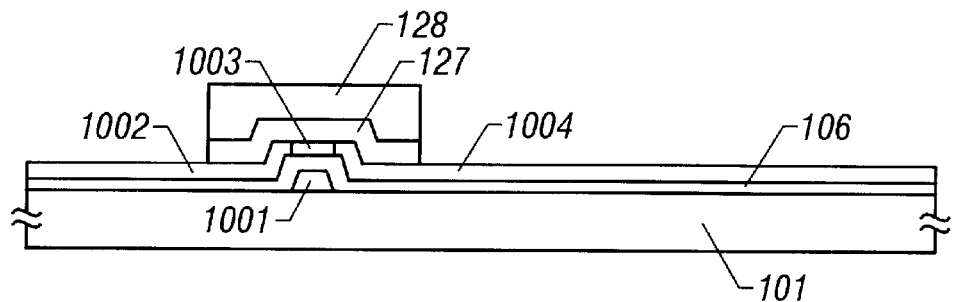
FIGS. 10A to 10D are diagrams schematically showing the CMOS elements juxtaposed to each other.

In the state shown in FIG. 10A, regions 1002 and 1004 of the active layer are exposed. Here, the region 1002 is a source region, and the region 1004 is a drain region. These regions have the N-type because the present embodiment utilizes the NTFTs as pixel TFTs. On the other hand, numeral 1003 designates a channel region, and numeral 1001 designates a gate electrode.

Moreover, numeral 127 designates a silicon nitride film forming a first interlayer insulating film, and numeral 128 designates a resin film (or polyimide film) forming the first interlayer insulating film.

Figure 10B:
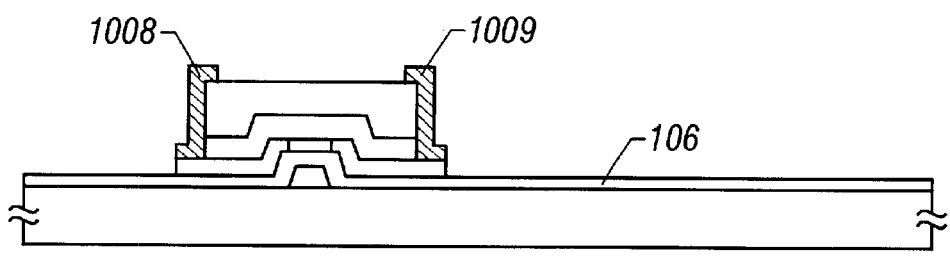

After the state shown in FIG. 10A was established, a source electrode 1008 and a drain electrode 1009 are formed of the laminated film which is composed of the titanium, aluminum and titanium films as shown in FIG. 10B.

At this time, the exposed active layer is etched subsequent to the patterning of the laminated film of the titanium, aluminum and titanium films. As a result, the active layer can be patterned in self-alignment.

Thus, there is established the state of FIG. 10B, in which the gate insulating film 106 is exposed.

Figure 10C:
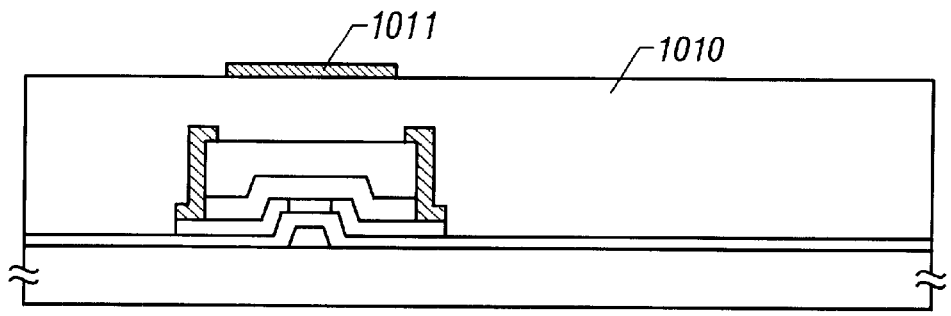

Next, a second interlayer insulating film 1010 of polyimide resin is formed, as shown in FIG. 10C. Then, a light shielding film 1011 is formed of a titanium film. This light shielding film is constructed to have the BM (i.e., black matrix), too.

Figure 10D:
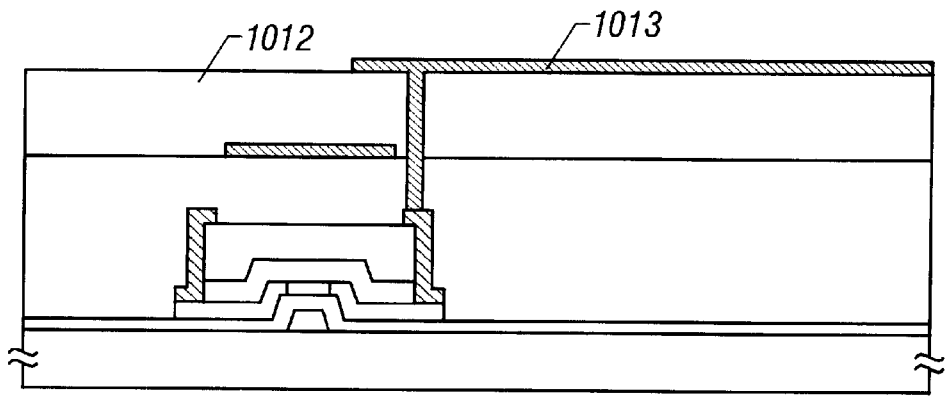

Next, a third interlayer insulating film 1012 is formed of a polyimide resin, as shown in FIG. 10D. Then, contact holes are formed to form pixel electrodes of ITO, as designated by 1013. Thus, there are formed the TFTs (or pixel TFTs) to be arranged in the active matrix circuit.

[Embodiment 6]

The present embodiment relates to TFTs which have a structure different from that of Embodiment 1. The manufacture steps of the present embodiment are shown in FIGS. 11 to 17, in which the same reference numerals as those shown in FIGS. 1 to 5 designate the same portions.

Figure 11:
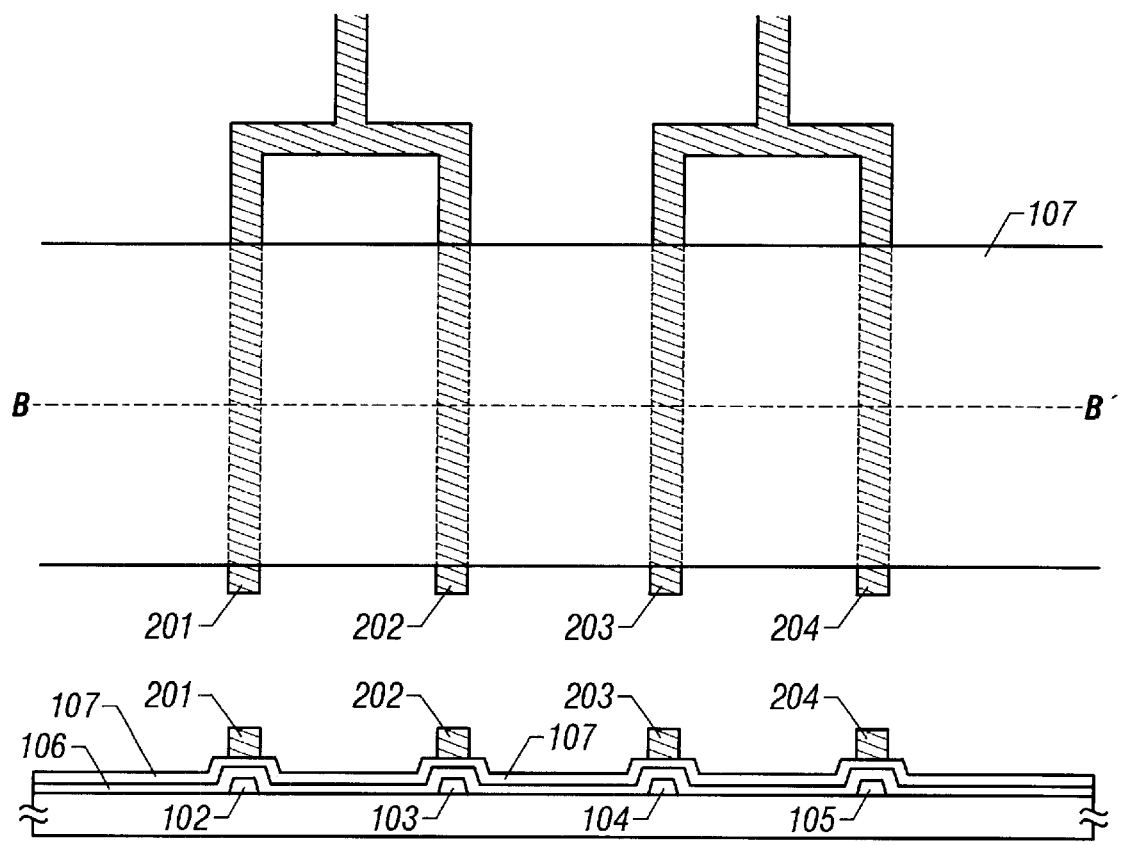
FIG. 11 is a diagram showing a manufacture step of an embodiment.

First of all, the state shown in FIG. 11 is established according to the process of Embodiment 1. In the present embodiment, the state before the doping with the impurity, as shown in FIG. 2, is established according to the process of Embodiment 1. Thus, there is established the state, as shown in FIG. 11.

In FIG. 11, reference numeral 101 designates a glass substrate (or quarts substrate). Numerals 102, 103, 104 and 105 designate gate electrodes. The gate electrodes 102 and 103 are extended and made common, and the gate electrodes 104 and 105 are also extended and made common.

Numeral 106 designates a silicon oxide film for forming a gate insulating film. On the other hand, numeral 107 designates an amorphous silicon film.

Numerals 201, 202, 203 and 204 designate resist masks which are formed by exposing the back of the substrate while using the gate electrodes 102 to 105.

Figure 12:
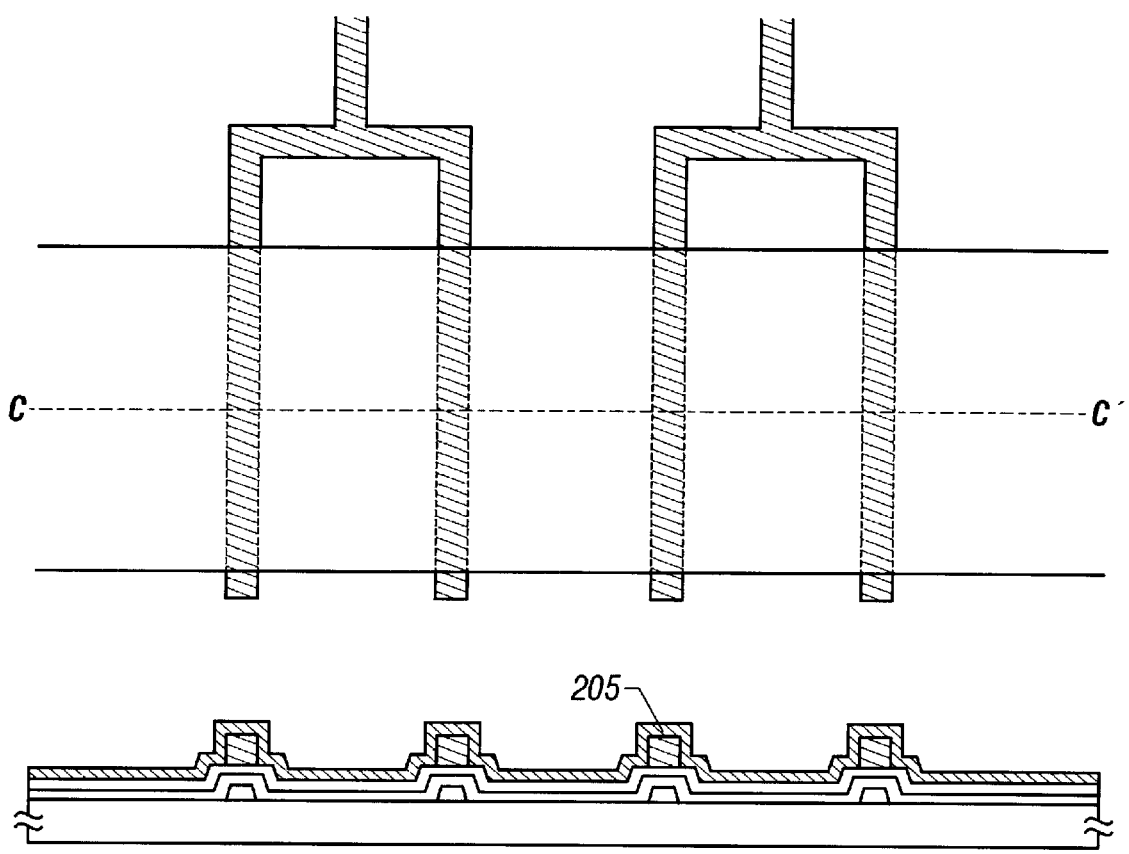
FIG. 12 is a diagram showing a manufacture step of the embodiment.

When the state shown in FIG. 11 is established, an amorphous silicon film 105 having a P-type is formed by the plasma CVD method, as shown in FIG. 12.

Next, the resist masks 201, 202, 203 and 204 are removed by using a special solvent. As a result, there is established a state, as shown in FIG. 13.

Figure 13:
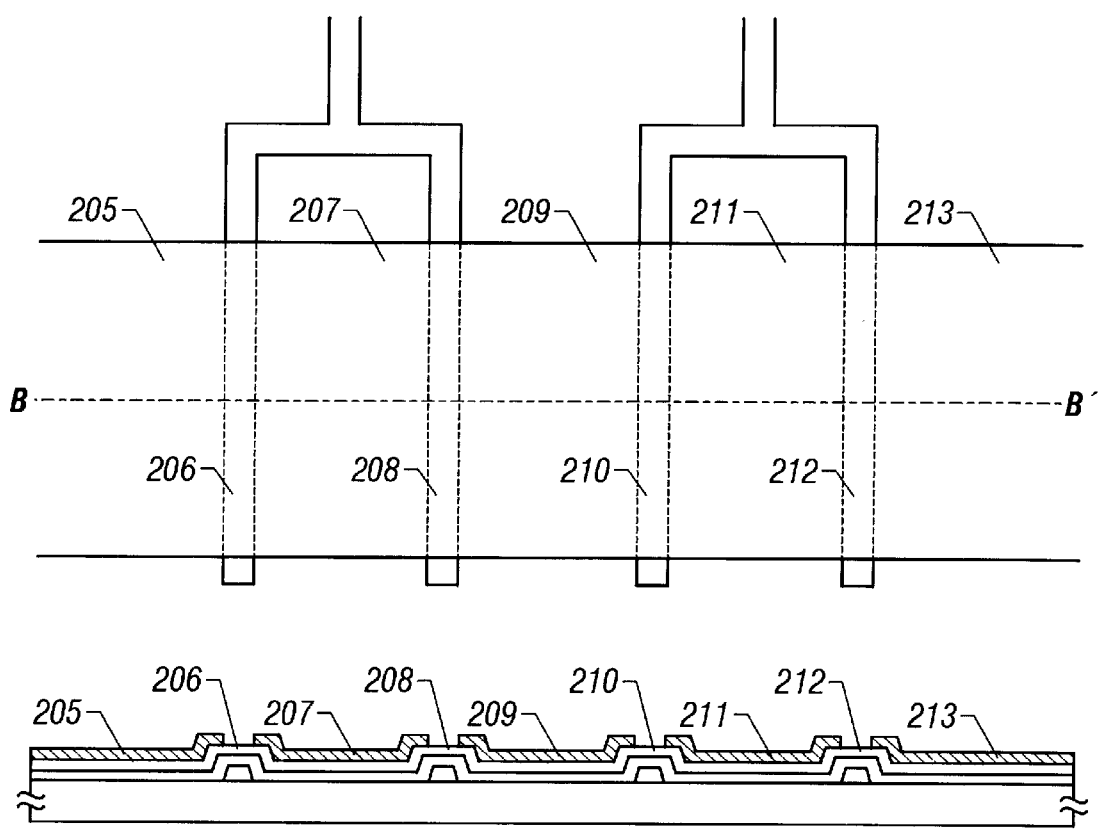
FIG. 13 is a diagram showing a manufacture step of the embodiment.

Numerals 206, 208, 210 and 212 appearing in FIG. 13 designate channel regions. Here, regions 205, 207, 209, 211 and 213 have the P-type.

Figure 14:
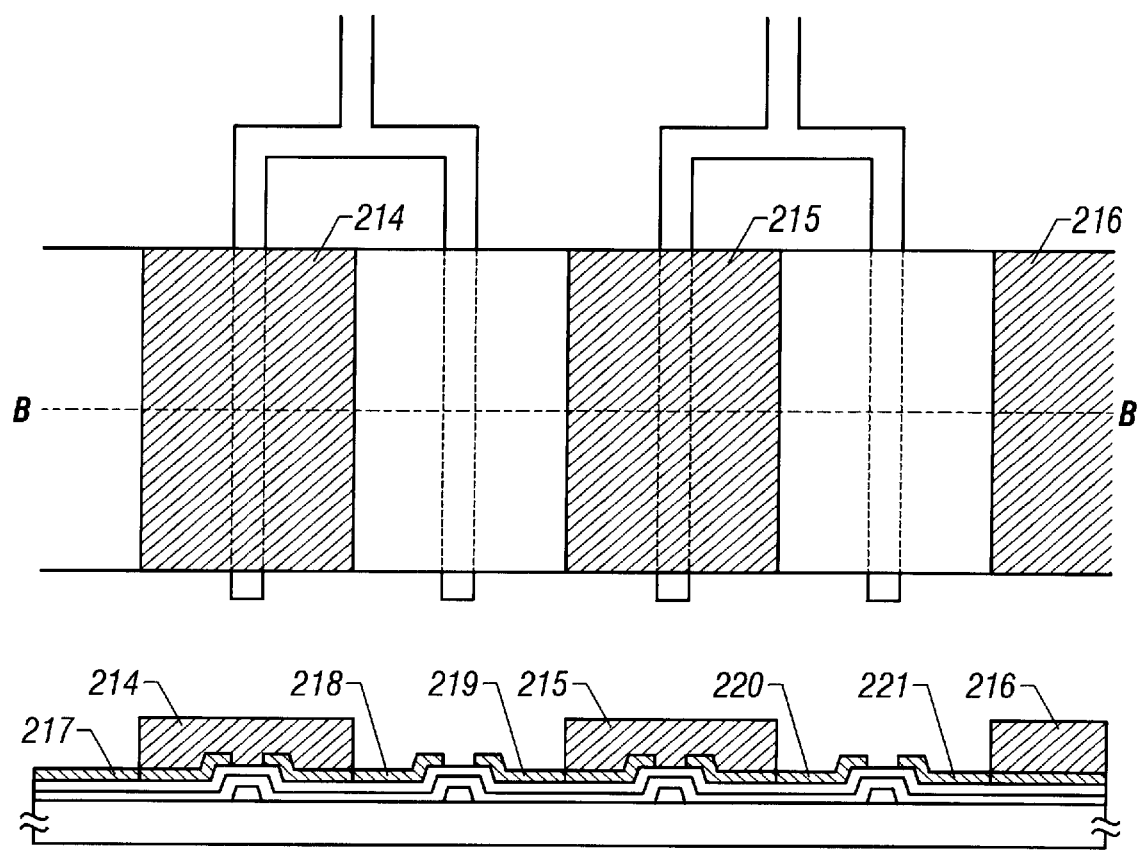
FIG. 14 is a diagram showing a manufacture step of the embodiment.

Next, resist masks 214, 215 and 216 are arranged, as shown in FIG. 14, and are doped with a P (phosphor) element. At this step, regions 217, 218, 219, 220 and 221 are inverted in their conduction type to N-type regions. Then, the resist masks 214, 215 and 216 are removed to establish the state shown in FIG. 15.

Figure 15:
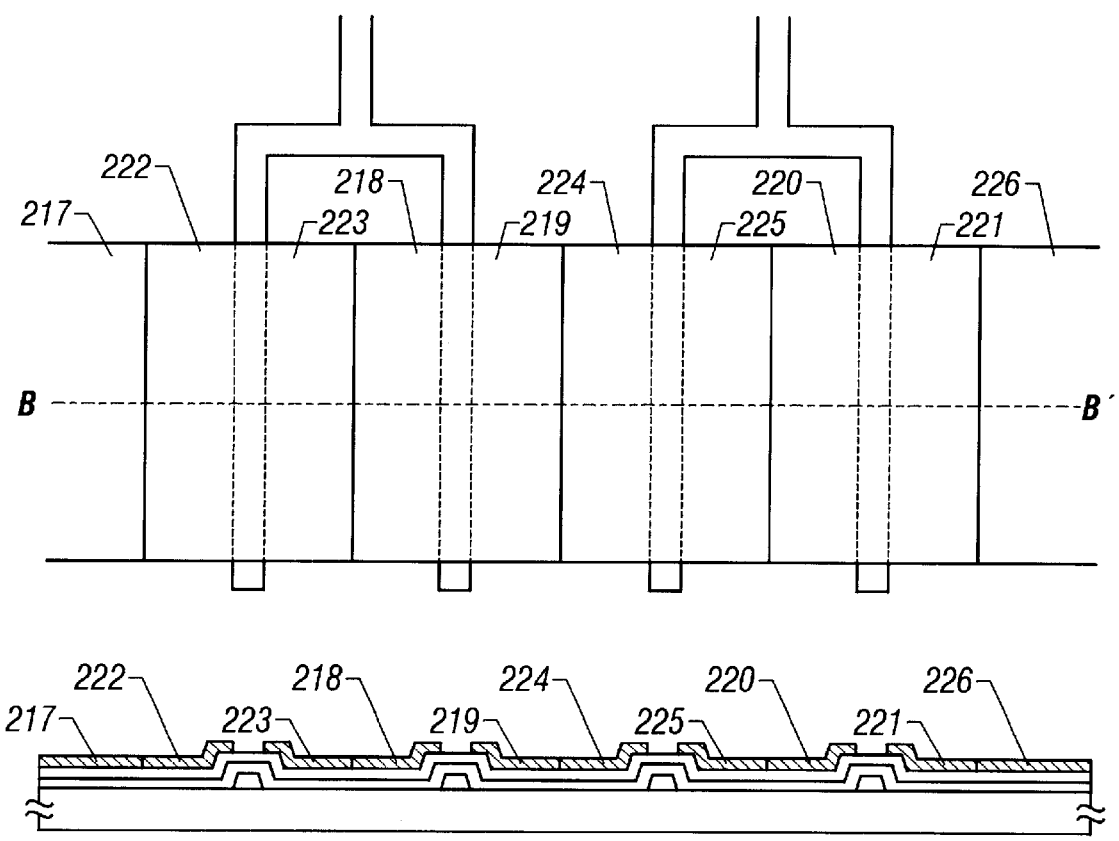
FIG. 15 is a diagram showing a manufacture step of the embodiment.

In the state of FIG. 15, the numerals 217, 218, 219, 220 and 221 designate the N-type regions for forming the source and drain regions of the NTFTs.

On the other hand, the numerals 222, 223, 224, 225 and 226 designate the N-type regions for forming the source and drain regions of the PTFTs.

Figure 16:
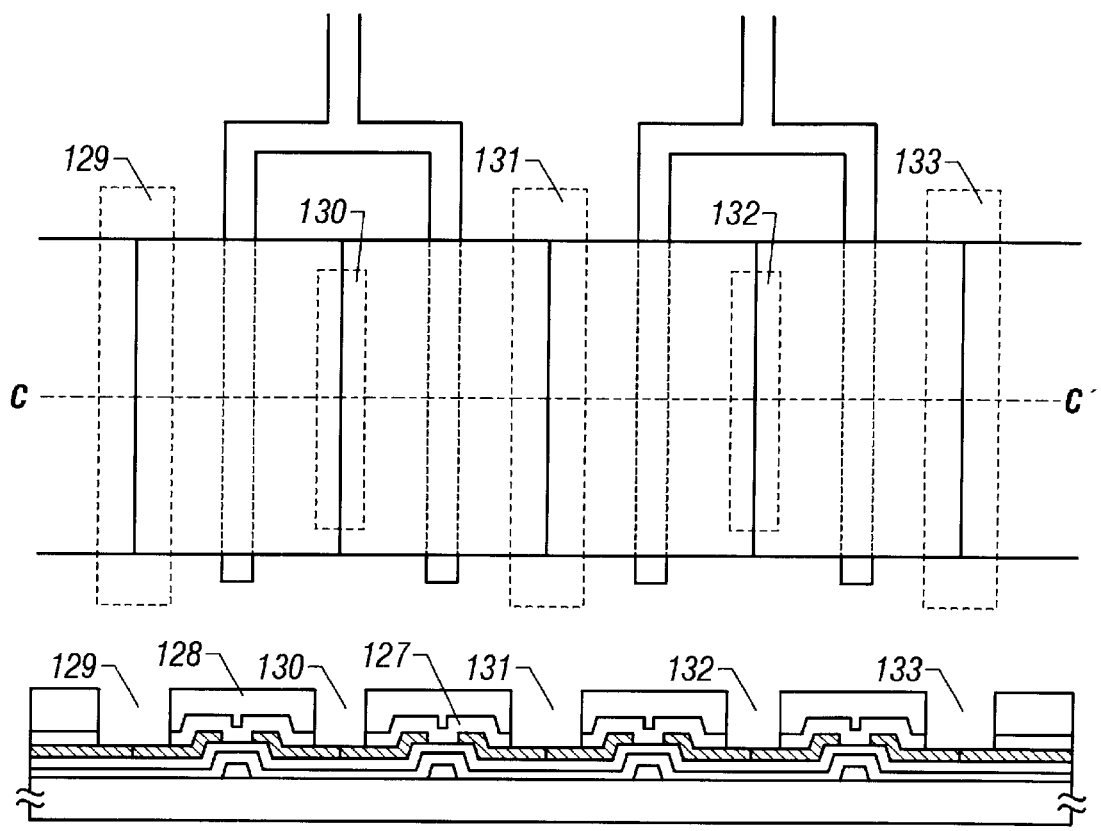
FIG. 16 is a diagram showing a manufacture step of the embodiment.

Next, a silicon nitride film 127 and a polyimide film 128 are formed as the interlayer insulating film, as shown in FIG. 16. Then, contact holes 129, 130, 131, 132 and 133 are formed by the dry etching method. At this time, the dry etching is performed by using the not-shown resist mask to form the holes 129, 130, 131, 132 and 133.

As a result of this dry etching step, there is established a state in which the semiconductor layer is exposed in the open bottom portions.

Figure 17:
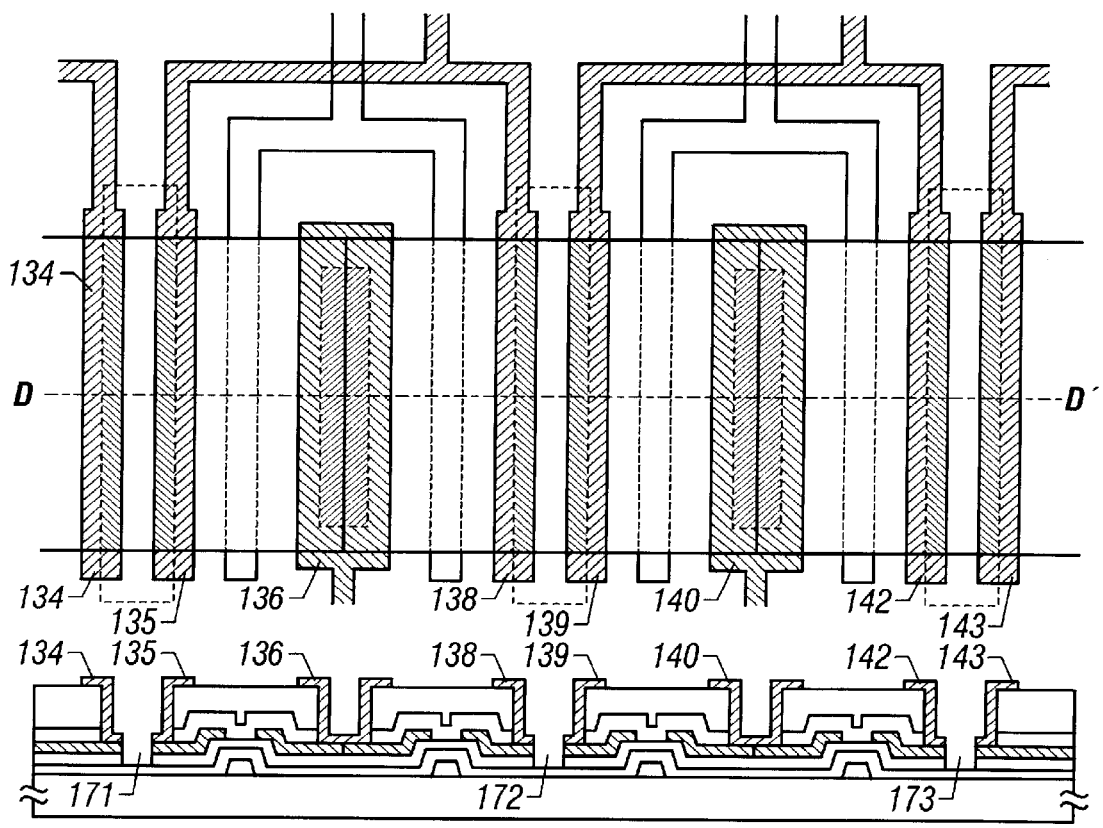
FIG. 17 is a diagram showing a manufacture step of the embodiment.

When the state of FIG. 16 is established, metal electrodes 134, 135, 136, 138, 139, 140, 142 and 143 are formed, as shown in FIG. 17.

At this time, the semiconductor layer is separated for each CMOS element by removing its portions 171, 172 and 173.

[Embodiment 7]

The present embodiment presents specific examples of devices which are given various display functions by making use of the construction according to Embodiment 1.

Figure 18A:
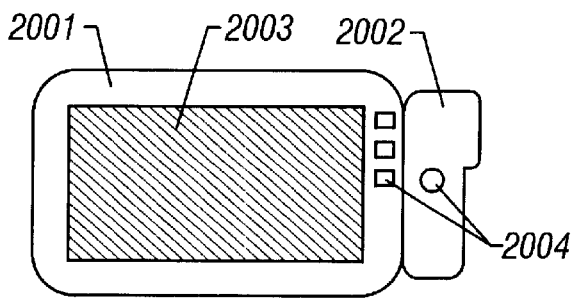
FIGS. 18A to 18F are views schematically showing devices according to the present invention.

What is shown in FIG. 18A is a portable data processing terminal. This device is equipped in its body 2001 with an active matrix type liquid crystal display device 2003, control buttons 2004 and a CCD camera 2002. This device has functions to draw the data from the telephone line and to send the data through the telephone line.

The device can be further given functions to process and display the data coming from the satellite or from various radio wave media not through the telephone line.

The type of the liquid crystal panel to be used in the display device 2003 can be exemplified by the transmission type or the reflection type. This reflection type is more advantageous for the lower power consumption.

Figure 18B:
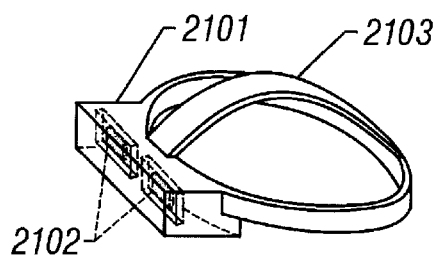

What is shown in FIG. 18B is a device called the "head mount display." This device is mounted on a human head and given a function to make a display as if an image were viewed directly in front of eyes. This device has a body 2101 which is equipped with an active matrix type liquid crystal display device 2102 so that it may be fixed on the head through a band 2103.

The liquid crystal panel can be exemplified by the transmission type or the reflection type.

Figure 18C:
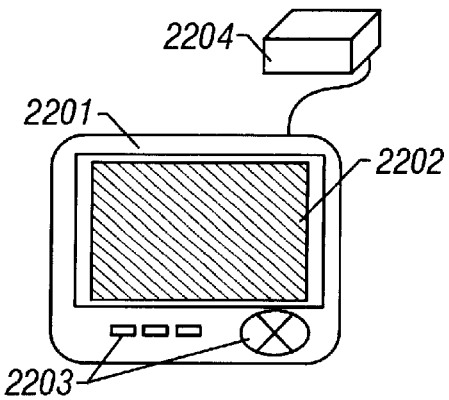

What is shown in FIG. 18C is a car navigation system, as called so. This device is equipped in its body 2201 with an active matrix type liquid crystal display device 2202 and control buttons 2203 and given a function to receive radio waves from the satellites through an antenna 2204.

Another function is to display the map data or others, as received from the satellites, in the liquid crystal display device 2204. The liquid crystal panel can be exemplified by the transmission type or the reflection type.

Figure 18D:
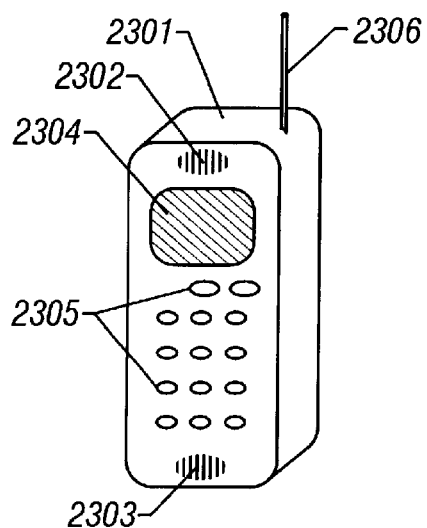

What is shown in FIG. 18D is a portable telephone, which is equipped in its body 2301 with an active matrix type liquid crystal display device 2304, a voice input unit 2303, a voice output unit 2302, control buttons 2305 and an antenna 2306. The liquid crystal panel is usually exemplified by the reflection type.

Figure 18E:
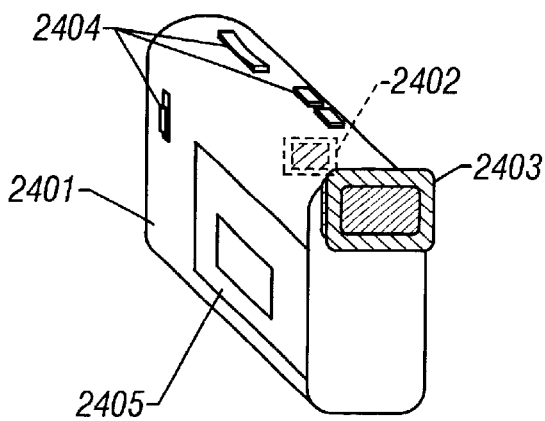

What is shown in FIG. 18E is a portable video camera, which is equipped in its body 2401 with control buttons 2404, an active matrix type liquid crystal display device 2402, an eyepiece portion 2403 for viewing an image displayed in the display device 2402, and a tape holder 2405 holding a magnetic tape for storing the taken images.

The liquid crystal panel composing the display device 2402 is usually exemplified by the transmission type for forming an image by modulating the light coming from a backlight.

Figure 18F:
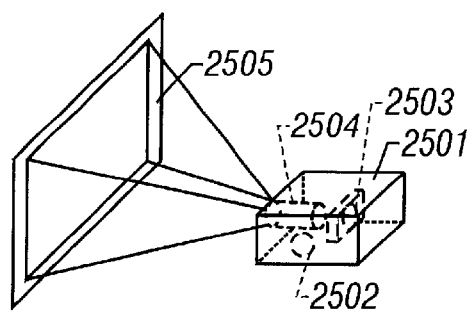

What is shown in FIG. 18F is a projection type projector, which is equipped in its body 2501 with an active matrix type liquid crystal display device 2503 for optically modulating the light coming from a light source 2502. As shown, the display device 2503 is exemplified by a reflection type liquid crystal panel.

The image, as optically modulated by the liquid crystal display device 2503, is magnified by an optical system 2504 and projected on a screen 2505. When the image is to be viewed, the viewer observes the image which is projected on the screen 2505 from the body side.

By making use of the invention disclosed herein, the interval of TFTs can be narrowed in the construction in which the TFTs are juxtaposed. The interval can also be narrowed when the CMOS circuits are arrayed in a line. Moreover, a high degree of integration can be achieved.

When the invention disclosed herein is applied to the peripheral drive circuit of the active matrix type liquid crystal display device, on the other hand, the switch circuits can be arranged in a line. This arrangement can solve the problem of a crystal dispersion in the crystallization technique utilizing the linear laser annealing. Moreover, the discrepancy in the wiring impedance between the switch circuits can be corrected.

What is claimed is:

1. A method of manufacturing a semiconductor device comprising the steps of:
   forming a semiconductor film over a substrate;
   forming a gate electrode adjacent to the semiconductor film with a gate insulating film interposed therebetween;
   forming a first insulating film over the semiconductor film and the gate electrode;
   forming a first electrode in contact with the semiconductor film and in contact with the first insulating film; and
   etching the first electrode and the semiconductor film so that a side surface of the first electrode is aligned with a side surface of the semiconductor film.

2. A method according to claim 1, wherein the semiconductor film comprises amorphous silicon.

3. A method according to claim 1, wherein the gate electrode comprises aluminum.

4. A method according to claim 1, wherein the first electrode comprises a laminated structure of aluminum and titanium.

5. A method according to claim 1, wherein the first insulating film is at least one selected from the group consisting of polyimide, polyamide, and polyimide amide.

6. A method according to claim 1, wherein the semiconductor device is an active matrix type liquid crystal display device.

7. A method according to claim 1, wherein the semiconductor device is an active matrix type display device employing EL elements.

8. A method according to claim 1, wherein the semiconductor device is at least one selected from the group consisting of a portable data processing terminal, a head mount display, a car navigation system, a portable telephone, a video camera, and a projector.

9. A method of manufacturing a semiconductor device comprising the steps of:
   forming a semiconductor film over a substrate;
   forming a gate electrode adjacent to the semiconductor film with a gate insulating film interposed therebetween;
   forming a first insulating film over the semiconductor film and the gate electrode;
   forming a plurality of first electrodes in contact with the semiconductor film and in contact with the first insulating film; and
   etching the semiconductor film into a plurality of semiconductor layers using at least the plurality of first electrodes as masks.

10. A method according to claim 9, wherein the semiconductor film comprises amorphous silicon.

11. A method according to claim 9, wherein the gate electrode comprises aluminum.

12. A method according to claim 9, wherein the first electrode comprises a laminated structure of aluminum and titanium.

13. A method according to claim 9, wherein the first insulating film is at least one selected from the group consisting of polyimide, polyamide, and polyimide amide.

14. A method according to claim 9, wherein the semiconductor device is an active matrix type liquid crystal display device.

15. A method according to claim 9, wherein the semiconductor device is an active matrix type display device employing EL elements.

16. A method according to claim 9, wherein the semiconductor device is at least one selected from the group consisting of a portable data processing terminal, a head mount display, a car navigation system, a portable telephone, a video camera, and a projector.

17. A method of manufacturing a semiconductor device comprising the steps of:
   forming a semiconductor film over a substrate;
   forming a gate electrode adjacent to the semiconductor film with a gate insulating film interposed therebetween;
   irradiating the semiconductor film with a laser light;
   forming a first insulating film over the semiconductor film and the gate electrode;
   forming a first electrode in contact with the semiconductor film and in contact with the first insulating film; and
   etching the first electrode and the semiconductor film so that a side surface of the first electrode is aligned with a side surface of the semiconductor film.

18. A method according to claim 17, wherein the semiconductor film comprises crystalline silicon.

19. A method according to claim 17, wherein the gate electrode comprises aluminum.

20. A method according to claim 17, wherein the first electrode comprises a laminated structure of aluminum and titanium.

21. A method according to claim 17, wherein the first insulating film is at least one selected from the group consisting of polyimide, polyamide, and polyimide amide.

22. A method according to claim 17, wherein the semiconductor device is an active matrix type liquid crystal display device.

23. A method according to claim 17, wherein the semiconductor device is an active matrix type display device employing EL elements.

24. A method according to claim 17, wherein the semiconductor device is at least one selected from the group consisting of a portable data processing terminal, a head mount display, a car navigation system, a portable telephone, a video camera, and a projector.

25. A method of manufacturing a semiconductor device comprising the steps of:

forming a semiconductor film over a substrate;

forming a gate electrode adjacent to the semiconductor film with a gate insulating film interposed therebetween;

irradiating the semiconductor film with a laser light;

forming a first insulating film over the semiconductor film and the gate electrode;

forming a plurality of first electrodes in contact with the semiconductor film and in contact with the first insulating film; and etching the semiconductor film into a plurality of semiconductor layers using at least the plurality of first electrodes as masks.

26. A method according to claim 25, wherein the semiconductor film comprises crystalline silicon.

27. A method according to claim 25, wherein the gate electrode comprises aluminum.

28. A method according to claim 25, wherein the first electrode comprises a laminated structure of aluminum and titanium.

29. A method according to claim 25, wherein the first insulating film is at least one selected from the group consisting of polyimide, polyamide, and polyimide amide.

30. A method according to claim 25, wherein the semiconductor device is an active matrix type liquid crystal display device.

31. A method according to claim 25, wherein the semiconductor device is an active matrix type display device employing EL elements.

32. A method according to claim 25, wherein the semiconductor device is at least one selected from the group consisting of a portable data processing terminal, a head mount display, a car navigation system, a portable telephone, a video camera, and a projector.

33. A method of manufacturing a semiconductor device comprising the steps of:

forming a semiconductor film over a substrate;

forming a gate electrode adjacent to the semiconductor film with a gate insulating film interposed therebetween;

irradiating the semiconductor film with a laser light from a backside of the substrate;

forming a first insulating film over the semiconductor film and the gate electrode;

forming a first electrode in contact with the semiconductor film and in contact with the first insulating film; and etching the first electrode and the semiconductor film so that a side surface of the first electrode is aligned with a side surface of the semiconductor film.

34. A method according to claim 33, wherein the semiconductor film comprises crystalline silicon.

35. A method according to claim 33, wherein the gate electrode comprises aluminum.

36. A method according to claim 33, wherein the first electrode comprises a laminated structure of aluminum and titanium.

37. A method according to claim 33, wherein the first insulating film is at least one selected from the group consisting of polyimide, polyamide, and polyimide amide.

38. A method according to claim 33, wherein the semiconductor device is an active matrix type liquid crystal display device.

39. A method according to claim 33, wherein the semiconductor device is an active matrix type display device employing EL elements.

40. A method according to claim 33, wherein the semiconductor device is at least one selected from the group consisting of a portable data processing terminal, a head mount display, a car navigation system, a portable telephone, a video camera, and a projector.

41. A method of manufacturing a semiconductor device comprising the steps of:

forming a semiconductor film over a substrate;

forming a gate electrode adjacent to the semiconductor film with a gate insulating film interposed therebetween;

irradiating the semiconductor film with a laser light from a backside of the substrate;

forming a first insulating film over the semiconductor film and the gate electrode;

forming a plurality of first electrodes in contact with the semiconductor film and in contact with the first insulating film; and etching the semiconductor film into a plurality of semiconductor layers using at least the plurality of first electrodes as masks.

42. A method according to claim 41, wherein the semiconductor film comprises crystalline silicon.

43. A method according to claim 41, wherein the gate electrode comprises aluminum.

44. A method according to claim 41, wherein the first electrode comprises a laminated structure of aluminum and titanium.

45. A method according to claim 41, wherein the first insulating film is at least one selected from the group consisting of polyimide, polyamide, and polyimide amide.

46. A method according to claim 41, wherein the semiconductor device is an active matrix type liquid crystal display device.

47. A method according to claim 41, wherein the semiconductor device is an active matrix type display device employing EL elements.

48. A method according to claim 41, wherein the semiconductor device is at least one selected from the group consisting of a portable data processing terminal, a head mount display, a car navigation system, a portable telephone, a video camera, and a projector.

* * * * *